United States Patent [19]

Brust

[11] Patent Number: 5,424,961
[45] Date of Patent: Jun. 13, 1995

[54] PROCESS AND SYSTEM FOR MEASURING THE TEMPORAL COURSE OF A PERIODIC SIGNAL HAVING HIGH TIME RESOLUTION ACCORDING TO A "BOXCAR-LIKE" PROCESS

[76] Inventor: Hans-Detlef Brust, Martin-Luther-Str. 2, D-6602 Dudweiler, Germany

[21] Appl. No.: 190,213

[22] Filed: Feb. 1, 1994

Related U.S. Application Data

[63] Continuation of Ser. No. 24,811, Mar. 1, 1993, abandoned, which is a continuation of Ser. No. 892,626, Jun. 2, 1992, abandoned, which is a continuation of Ser. No. 439,036, Mar. 1, 1991, abandoned.

[30] Foreign Application Priority Data

Mar. 4, 1988 [DE] Germany ............... 38 07 147.9

[51] Int. Cl.[6] ............................... G06F 15/20
[52] U.S. Cl. .................... 364/551.01; 364/575
[58] Field of Search ............. 364/551.01, 575, 576, 364/725, 726, 727, 551.01

[56] References Cited

U.S. PATENT DOCUMENTS

| | | | |
|---|---|---|---|
| 3,541,458 | 11/1970 | Klund | 364/576 X |
| 4,352,094 | 9/1982 | Reneric | 364/575 X |
| 4,554,629 | 11/1985 | Smith, Jr. | 364/725 X |
| 4,621,337 | 11/1986 | Cates et al. | 364/727 |
| 4,721,855 | 1/1988 | Fazekas | 250/310 |
| 4,760,543 | 7/1988 | Ligtenberg et al. | 364/725 |
| 4,791,390 | 12/1988 | Harris et al. | 364/725 X |
| 4,831,328 | 5/1989 | Brust | 250/310 |
| 4,839,844 | 6/1989 | Watari | 364/727 |
| 4,885,534 | 12/1989 | Eck et al. | 250/310 |
| 4,887,031 | 12/1989 | Brust | 250/310 |

Primary Examiner—Ellis B. Ramirez
Attorney, Agent, or Firm—Evenson McKeown Edwards & Lenahan

[57] ABSTRACT

By the selection of an optimized base (A') which is composed of n sampling functions ($S_1, S_2, \ldots S_n$), a better signal-to-noise ratio is obtained during measuring. After projections of the measured values (f*) obtained from the sampling by the formation of scalar products from the measured values and the sampling functions ($f^* \cdot S^T_1, f^* \cdot S^T_2, \ldots, f^* \cdot S^T_n$), a final coordinate retransformation is carried out in order to get from the representation in the optimized base (A') to a representation in the unit base (A).

27 Claims, 5 Drawing Sheets

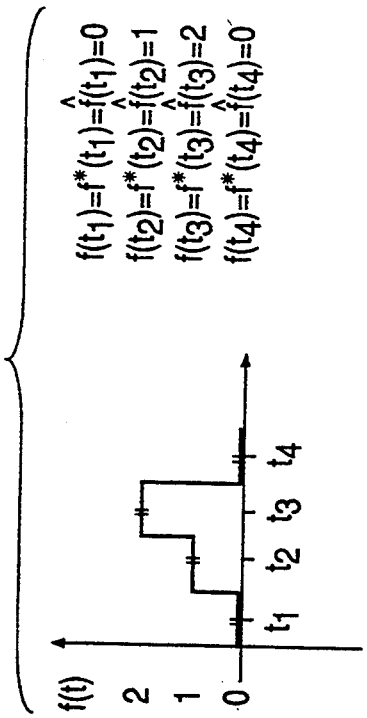

FIG. 2a

$f(t_1) = f^*(t_1) = \hat{f}(t_1) = 0$
$f(t_2) = f^*(t_2) = \hat{f}(t_2) = 1$
$f(t_3) = f^*(t_3) = \hat{f}(t_3) = 2$
$f(t_4) = f^*(t_4) = \hat{f}(t_4) = 0$

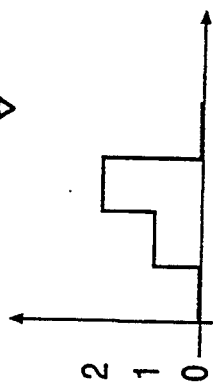

FIG. 2c

$$0 \cdot S_1 + 1 \cdot S_2 + 2 \cdot S_3 + 0 \cdot S_4$$

$$= 0 \cdot \begin{pmatrix}1\\0\\0\\0\end{pmatrix}^T + 1 \cdot \begin{pmatrix}0\\1\\0\\0\end{pmatrix}^T + 2 \cdot \begin{pmatrix}0\\0\\1\\0\end{pmatrix}^T + 0 \cdot \begin{pmatrix}0\\0\\0\\1\end{pmatrix}^T = \begin{pmatrix}0\\1\\2\\0\end{pmatrix}^T$$

$$\Downarrow$$

$$1/4(3 \cdot S_1 + 1 \cdot S_2 + 3 \cdot S_3 + 1 \cdot S_4)$$

$$= 1/4 \left( 3 \cdot \begin{pmatrix}1\\1\\1\\1\end{pmatrix}^T + 1 \cdot \begin{pmatrix}1\\1\\-1\\-1\end{pmatrix}^T + 3 \cdot \begin{pmatrix}-1\\1\\1\\-1\end{pmatrix}^T + 1 \cdot \begin{pmatrix}1\\-1\\1\\-1\end{pmatrix}^T \right)$$

PROCESS AND SYSTEM FOR MEASURING THE TEMPORAL COURSE OF A PERIODIC SIGNAL HAVING HIGH TIME RESOLUTION ACCORDING TO A "BOXCAR-LIKE" PROCESS

This application is a continuation of application Ser. No. 08/024,811, filed on Mar. 1, 1993, which is a continuation of application Ser. No. 07/892,626, filed Jun. 2, 1992; which is a continuation of application Ser. No. 07/439,036, filed on Mar. 1, 1991, now abandoned.

The invention relates to a process for measuring the temporal course of a period signal having high time resolution according to a "boxcar-like" process, in which the selection of a generating system occurs which is composed of n sampling functions with a maximum of n individual elements each, per period a maximum of n signal values of the signal are sampled at n (n=integer) sampling points and in this manner n measured values are determined, projections of the measured values are formed by the scalar products from the measured values and the sampling functions.

In measuring periodic signals having high noise interference, often a sampling process or a combination sampling and averaging process is used. For this purpose, so-called boxcar integrators are frequently employed. The sampling process warrants a high time resolution as it takes temporally staggered sections from a series of periods and composes them to a slower new sample of the same form. An averaging process provides a good signal-to-noise ratio as the measured value is multiply sampled and averaged over a series of periods. Measuring with a combined sampling and averaging process proceeds as follows by way of illustration.

A time interval, during which the signal to be measured is divided into several sampling points, or sampling intervals. The time between the sampling points or intervals is usually the same. In the embodiments described later herein, these sampling points or sampling intervals are designated $t_1 \ldots t_n$. Subsequently, at each sampling point, the measuring signal is applied m times and the sampled values are added. This procedure is repeated at all sampling points. For this reason, the boxcar integrator requires a fast gate circuit, whereas the subsequent signal processing may occur more slowly. Thus, the overall measuring time during a time interval amount to n.m.T (T=period of the measuring signal) if the boxcar is able to conduct the measurements having a repetition frequency of 1/T. Should this not be the case, the maximum repetition frequency $v$ which the boxcar can process determines the maximum measuring rate. In this case the measuring time is n.m.1/$v$.

There are a great number of boxcar integrators known from technical literature. U.S. Pat. No. 4,486,660 describes a boxcar integrator basically consisting of a phase control unit, a delay unit, a gate circuit and a measurement processing unit. The block structure of a boxcar integrator and circuit in an electron beam measuring device is shown in FIG. 10 on Page 2 of the article "Electron Beam Testing, Methods and Applications" by H. P. Feuerbaum in the journal Scanning, Vol. 5 14/25 (1983). A boxcar integrator which works according to the combined sampling and averaging process is, for example, Model 162 of the firm Princeton Applied Research, cf. Model 162 Boxcar Averager EG&G, Princeton Applied Research Operating and Service Manual.

A drawback of the previously used boxcar integrators is the long measuring time resulting from the sampling process and the maximum measuring rate of the boxcar. Long measuring times lead to an unusually large number of measuring errors due to instabilities of the measuring system and drift occurrences. For reducing the measuring times in conventional boxcar processes, either a reduction has to be accepted of the time resolution (n less) or of the signal-to-noise ratio (m less).

It is the object of the invention to considerably reduce the measuring time of conventional boxcar processes, to raise the signal-to-noise ratio, to increase the amplitude or the energy of the measuring signal, and thereby make the measurement possible at all or simplify it. Moreover, the measurement processing system should be as simple as possible and also universally applicable, for example, in luminescence examinations, in oscillographic techniques or in infrared measuring techniques.

According to the invention, this object is achieved in that the selection of the n sampling functions is such that $$\sum_{j=1}^{n} ; |S|$$

is greater than n whereby a good signal-to-noise ratio during measuring is attained.

Further embodiments of the process according to the invention and their realization by means of a system are the object of the subclaims.

The advantages achieved by means of the invention, in particular, consist of reducing the measuring times and improving the signal-to-noise ratio considerably. Sampling up to n times per period raises the signal energy substantially compared to conventional processes. A further advantage is that the technical realization of the process is as simple as possible, as shall be made more apparent in the embodiments. It is also possible by means of this process to carry out measurements which could not be measured or could be measured only with great difficulty by conventional methods due to the low signal energy.

In FIG. 1, in all four diagrams, the ordinate represents the energy E for the signal portion S and noise portion N, $S_O$ representing the signal energy and $N_O$ representing the noise energy in a single sampling. The top two diagrams depict the signal energy and the noise energy in a conventional process, whereas the bottom diagrams illustrate the same for the process of the invention. On the left side of FIG. 1, the signal and noise energy are shown per period or measuring cycle, and on the right side following averaging over m periods or measuring cycles. With the new process (bottom row of diagrams), a maximum increase in signal energy of n can be seen compared to the conventional process, in which the integer n indicates the number of sampling points per period. After conducting m averaging (diagram bottom right), the signal-to-noise ratio is greater by a maximum of $2_n$ times than is the case in the conventional process (diagram top right). Thus, compared to the conventional process, in the process of the invention, the signal energy per measuring cycle is substantially increased, whereas the noise energy rises only minimally. An essential prerequisite of the process is therefore that the noise does not increase as much as or even more than the signal energy due to the altered sampling. Whether or not this prerequisite is fulfilled depends essentially on the respective noise mechanism. Undoubtedly, it is fulfilled if the noise is completely independent of the sampling. Such is the case, by way of illustration, if the noise is solely determined by the self noise of a detector employed for gaining the signals. In this event, and only in this event, if this condition is met, will the described advantage be obtained because the signal energy is raised by means of the described process. If, however, the noise is increased to the same extent as the signal energy (for example, as in the electron beam measuring technique due to the shot-effect noise of the PE current and the SE emission), the process does not offer an advantage over a conventional boxcar technique.

Figure 1A:
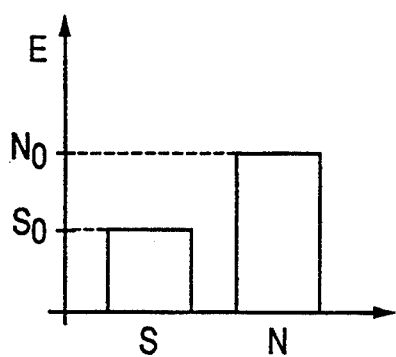
FIGS. 1a–1d show a synoptic view of a comparison of a conventional process and the process of the invention with respect to the signal energy or noise energy gained.
Figure 1B:
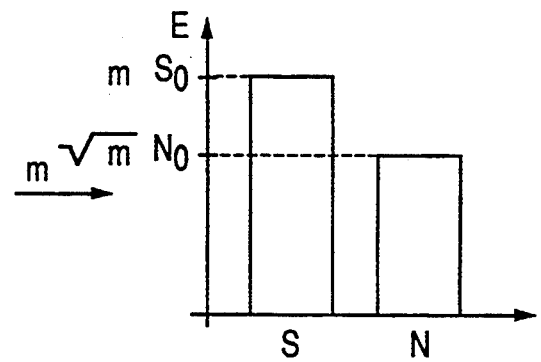
Figure 1C:
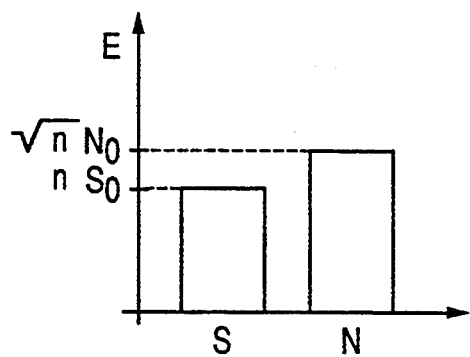
Figure 1D:
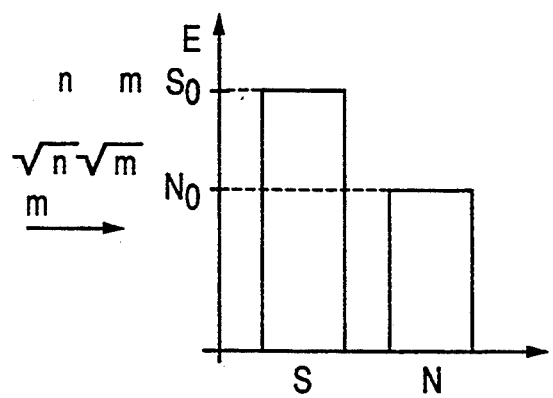
Figure 2B:
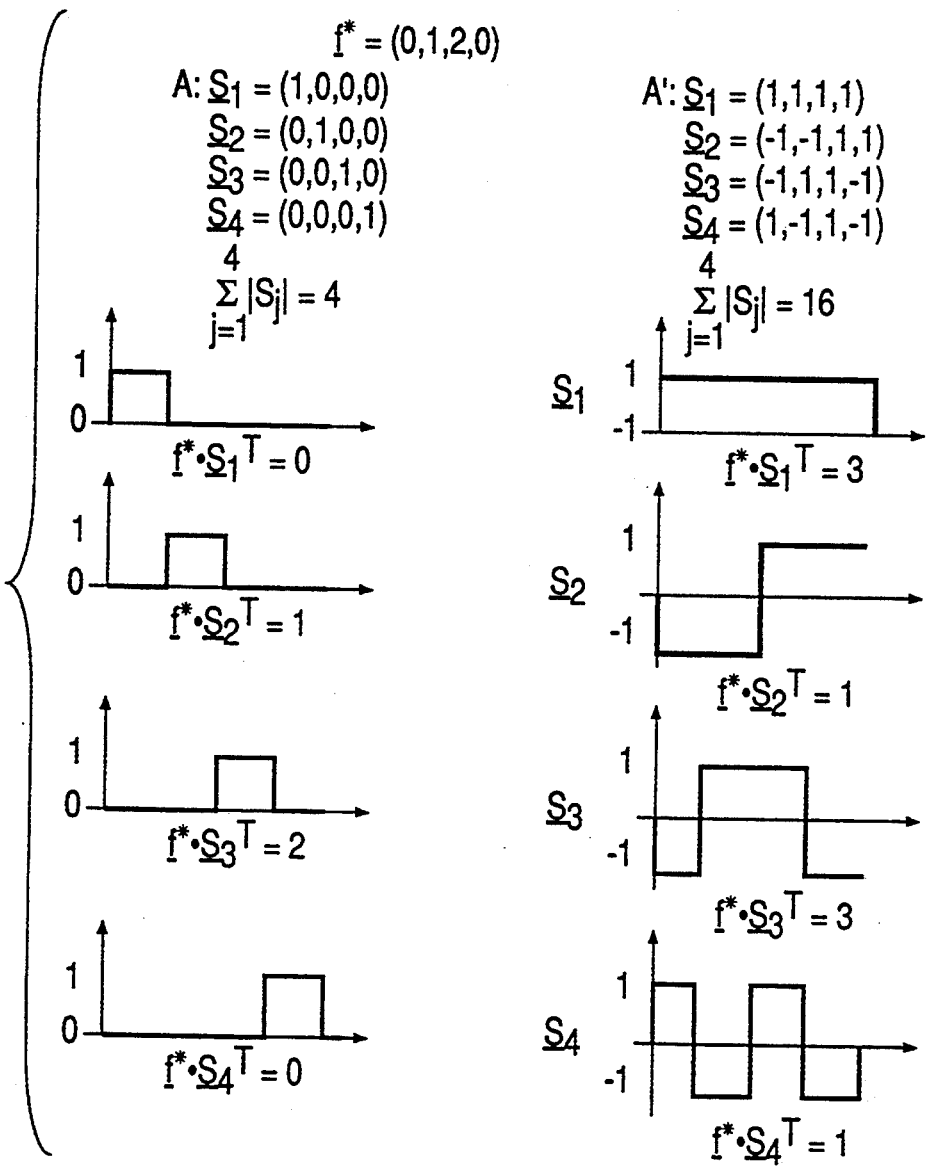
FIGS. 2 show an embodiment of the process.

FIG. 2 depicts a discrete signal f(t) which is to be measured. This discrete signal f(t) is described by means of four signal values $f(t_1)$, $f(t_2)$, $f(t_3)$ and $f(t_4)$ which are to be ascertained at four equidistant sampling times $t_1$, $t_2$, $t_3$, and $t_4$. Thus, in this case, n=4. With the conventional process for measuring the signal f(t), the signal is first sampled at the point in time $t_1$, and, in this manner, the measured value f* $(t_1)$ is gained; after which it is sampled at the point in time t2, and the measured value f*$(t_2)$ is obtained, and so on. In this manner, subsequently the measured values f*=f*$(t_1)$, f*$(t_2)$, f*$(t_3)$, f*$(t_4)$ are obtained, in the example illustrated in FIG. 2, thus, f*=(0, 1, 2, 0). As the signal f(t) can generally only be measured accompanied by much noise—by way of illustration, because the detector used to amplify the signal has high thermal self noise—, sampling usually is conducted at the points in time $t_i$ (i=1, ..., n) m times respectively. Subsequently, averaging can occur via the m measured values f*($t_i$) for each sampling point in time $t_i$ obtained by this means in order to improve the signal-to-noise ratio. If the noise and the measured values as well as the noise during the various measurements are not correlated, an averaging of this sort, which may occur in accordance with the various averaging algorithms familiar to the expert versed in the art, such as simple integration or exponential averaging, results in an improvement of the signal-to-noise ratio by a maximum of a factor υ (cf. FIG. 1, top row). By means of the averaging, an estimated value f ($t_i$) is attained for each point in time ti for the signal value f($t_i$) at this point in time, thus a total of n estimated values f($t_1$), ... F($t_n$). As the signal f(t) was assumed noiseless in the example depicted in FIG. 2, the measured values, estimated values and signal values of the respective sampling times concur in this simple case.

In this case,
$f(t_1) = f^*(t_1) = f(t_1) = 0$,
$f(t_2) = f^*(t_2) = f(t_2) = 1$,
$f(t_3) = f^*(t_3) = f(t_3) = 2$, -continued
$f(t_4) = f^*(t_4) = f(t_4) = 0$.

Yet, this simple example suffices to elucidate the process of the invention, as the advantages of the process of the invention are based on raising the signal energy per measuring cycle.

The conventional process can very easily be described mathematically if n sampling functions $S_i$ (i=1, ..., n) are introduced. In conventional processes, these sampling functions just correspond to the unit vectors. In the example of FIG. 2, therefore $S_1$=(1, 0, 0, 0), $S_2$=(0, 1, 0, 0), $S_3$=(0, 0, 1, 0) and $S_4$=(0, 0, 0, 1). Together, these sampling functions $S_i$ form a base A, namely the unit base. The sampling process may then be described as the multiplication of the signal to be measured, or its measured values, by the sampling functions $S_i$. Each measured value f*($t_i$) at a point in time $t_i$ thus becomes the scalar product of the signal to be measured f* and the respective sampling function $S_i$, thus f*($t_i$)=f*. $S^T_i$. In conventional, so-called boxcar integrators, this scalar product is conducted through a gate circuit and a subsequent integrator, the gate circuit providing for a multiplication of the signal to be measured transmitted to its input by the sampling function, by which the gate function is controlled. If the value of the sampling function is 0, the gate circuit blocks; on the other hand, if the value of the sampling function is 1, the gate circuit opens and conducts the input signal at this point in time to the subsequent integrator. Thus, the gate circuit takes over the component multiplication of the signal to be measured and the sampling function. The addition also required for the formation of the scalar product, on the other hand, is the task of the integrator. Moreover, the integrator may also take over the averaging over m measuring cycles.

By sampling according to the conventional process, the measured signal f(t), as it were, is represented in the coordinates of the unit base A. Although the representation of the measured signal f(t) in the unit base quite suits our conception—it actually corresponds to the temporal sequence of the process of f(t)—, it is, however, by no means the most favorable with regard to measuring techniques. The reason is that the measured signal energy is determined by the amounts $|f^* \cdot S^T_i|$, the signal course of f(t) naturally principally being random and uninfluenceable. On the other hand, the choice of the sampling functions $S^T_i$ is in principle, totally free. In order to attain a signal-to-noise ratio that is as good as possible while having a short measuring time, the sum of the amounts of the sampling functions $$\sum_{j=1}^{n} ; |S|$$

should, therefore, be as large as possible.

In the process of the invention, therefore, the discrete signal f(t) is measured in a different, more favorable base A'. For measuring, by way of illustration, a gate circuit followed by an integrator (=slow signal processing) may again be used.

In the process of the invention, on the right side in the example of FIG. 2, the sampling functions $S_1$ =(1, 1, 1, 1), $S_2$= −1, −1, 1, 1), $S_3$=(−1, 1, 1, −1) and $S_4$=(1, −1, 1, −1), together forming the base A' are selected It can be seen that on the right side of FIG. 2 the sum of the amounts of the sampling functions $$\sum_{j=1}^{n} ; |S|$$

having a value of 16 is greater than the sum of the amounts on the left side having a value of 4. In this manner, the signal energy measured during a period is raised, which favorably influences the signal-to-noise ratio when the measured values f* are multiplied by the sampling functions, which is mathematically described by the scalar products $f^*.S^T_1$, $f^*.S^T_2$, $f^*.S_3$, $f^*.S^T_4$. In this case the scalar products represent projections of the measured values f* gained by the sampling onto the respective sampling functions. It can be seen that these values with 3, 1, 3, 1 on the right side of FIG. 2 are greater than on the left side with 0, 1, 2, 0, which is attained by the more favorable choice of base A'. In order to return from the representation in the coordinates of base A' to the accustomed representation in the unit base on the left side and thereby to the measured and estimated values, a simple transformation of coordinates will do. In this case, this will be achieved by means of a linear transformation, by multiplying the projections by the respective sampling functions, adding these products and normalizing by ¼. Usually this inverse transformation is obtained in a simple manner by gathering the sampling functions in a matrix $S=(S_1 \ldots S_n)$ and forming the inverse of this matrix $S^{-1}$. The inverse matrix $S^{-1}$ then describes the linear representation to be carried out for the inverse transformation. In the present example, in accordance with the process according to the invention, the sampling functions $S_1=(1, 1, 1, 1)$, $S_2=(-1, -1, 1, 1)$, $S_3=(-1, 1, 1, -1)$, and $S_4=1, -1, 1, -1)$ were used as base A'. However, it is also possible to employ other sampling functions in order to make the signal-to-noise ratio optimal. For assessing the quality of a specific base with respect to the signal-to-noise ratio, the average square deviation L of the estimated value $f(t_i)$ of signal $f(t)$, thus $$L = ((f(t) - \hat{f}(t)) \cdot (f(t) - \hat{f}(t))^T)$$
with $f(t) = (f(t_1), f(t_2), f(t_3), \ldots, f(t_n))$
$\hat{f} = (\hat{f}(t_1), \ldots, \hat{f}(t_n))$ may be used. The optimal base with regard to the signal-to-noise ratio makes L maximal. Although, under certain circumstances, it may be advantageous not to select a completely optimal base of sampling functions in view of this criterion of optimality which, however, can be produced more easily technically than the optimal base.

Orthogonal bases are particularly advantageous, both with regard to this criterion of optimality as well as with regard to the technical realization. An orthogonal base is a base where the vectors are orthogonal with respect to one another. Function systems of this type, such as Rademacher or Walsh functions, are known from technical literature (cf. for example, NTZ journal (1970), Issue 4, "Die Erzeugung von Walsh Funktionen" by Klaus Bößwetter, pp. 201-207). These function systems are also advantageous because very fast algorithms exist for conducting the required coordinate inverse transformation similar to the "fast Fourier transformation FFT" (cf., for example, N. Ahmed, K. R. Rao: *Orthogonal Transforms for Digital Signal Processing*, Springer Verlag, Berlin 1975, Chapter 6).

Other function systems favorable for forming base A' are transorthogonal functions and functions forming lines or columns of Hadamard matrices (see, for example, A. Finger: *Digitale Signalstrukturen in der Informationstechnik*, R. Oldenbourg Verlag, Munich, 1985, Chapter 2.5). Particularly favorable with respect to the technical realization are functions yielded separately by cylindrical shifting.

Figure 3:
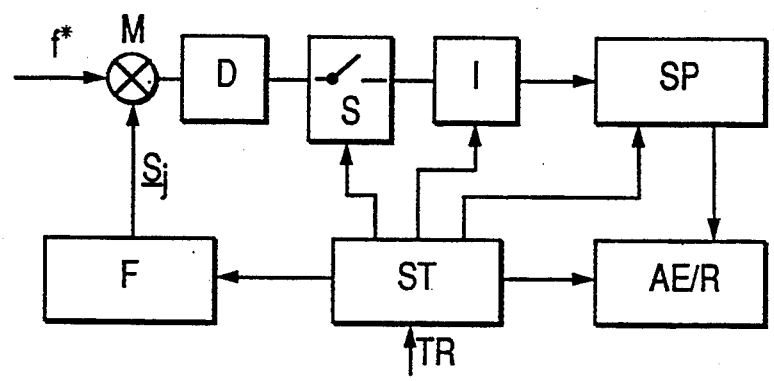
FIG. 3 illustrates a basic circuit for the process according to the invention.

FIG. 3 illustrates the basic diagram for the process of the invention. It contains the individual components depicted symbolically which are connected by way of various transfer systems, for example, by way of optical or electrical transfer systems. Among the most important individual components illustrated in FIG. 3 are: a multiplication unit M an integrator or a circuit for averaging I, in particular for conducting an averaging process, for example, a direct or exponential averaging process or for composing the average value, and a function generator F. A memory SP or a recording unit, a detector D and a switch S connected to the latter, a control ST and an output and calculator unit AE/R supplement the basic diagram of the process of the invention.

Figure 5:
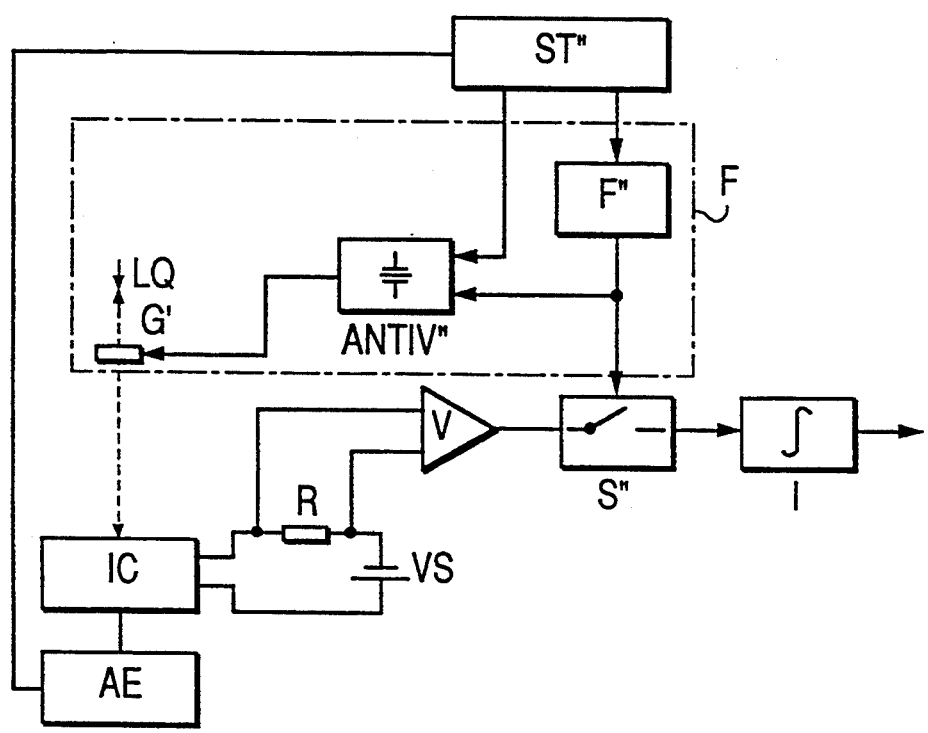

The individual components are not necessarily intended to be understood exclusively in the sense of a specific apparatus; for example, a physical effect may be utilized to realize the multiplication in multiplication unit M or the integration in the integrator I (cf. the description of FIG. 5). Furthermore, not all of the individual components are absolute necessary for the process of the invention. In many cases, switch S and, in some cases, detector D may not be necessary, for example, in the realization according to FIG. 5. However, switch S is advantageous if the signal to be measured only occurs with a relatively low repetition frequency and there are long pauses between the individual signal parts to be measured. During these pauses, switch S can separate detector D from integrator I and thereby prevent possible noise from these pauses from additionally adulterating the measuring result. During the actual measuring, switch S must, of course, be closed. If all data are first recorded in memory SP and the assessment plus the averaging are later carried out in the output and calculator unit .AE/R, an integrator I or a circuit for averaging may also not be necessary.

The multiplication unit M symbolizes the execution of a projection of the measured values f* onto the base vectors of A', mathematically described by the scalar products with the sampling functions $S_i (i=1, \ldots, n)$. In this case, the projection occurs partially directly by means of sampling during the measuring process. In this manner, the obtained measured values f* are brought to multiplication unit M which is, among other things, connected to a detector D which picks up the measured values f* and passes them on by way of a switch S to an integrator I or a circuit for averaging. Furthermore, the multiplication unit M is connected to a function generator F which supplies in temporal succession one of the n sampling functions $S_j$. In the simplest case, in the case of binary functions, the corresponding function generator F consists, for example, just of a ring shift register into which the sampling function $S_j$ is entered prior to measuring, for example, according to a "table-look-up" process. Another manner of realization of the function generator F is described in the cited publication by Klaus Bößwetter "Die Erzeugung von Walsh Funktionen". The task of the integrator I is forming, together with the multiplication unit M, the scalar product or its summation part. Moreover, an averaging over m measurements is performed with the aid of integrator I. This averaging may, however, also be undertaken later in an output calculator unit AE/R. For this purpose, the m measured values are first recorded in a memory and subsequently the averaging is carried out. The memory SP, on the one hand, is connected to the integrator I or a circuit for averaging and, on the other hand, to an output calculator unit AE/R which may also contain a monitor. The memory SP stores all the averaging values coming from the integrator I and passes them on to the output calculator unit AE/R when required. The task of the output calculator unit AE/R is to carry out the inverse transformation in order to return from the representation by the coordinates of base A' to the accustomed representation in the unit base A. An inverse transformation is not absolutely necessary if the representation of the signals can already be evaluated in base A'. If Walsh functions are taken as sampling functions, symmetry statements, for example, may already be made. The central control ST is connected to the function generator F, the switch S, the integrator I or a circuit for averaging, the memory SP and the output and calculator unit AE/R and controls the overall operation of all the components. The control ST itself may be directed with the aid of trigger signals at the trigger input TR.

Figure 4:
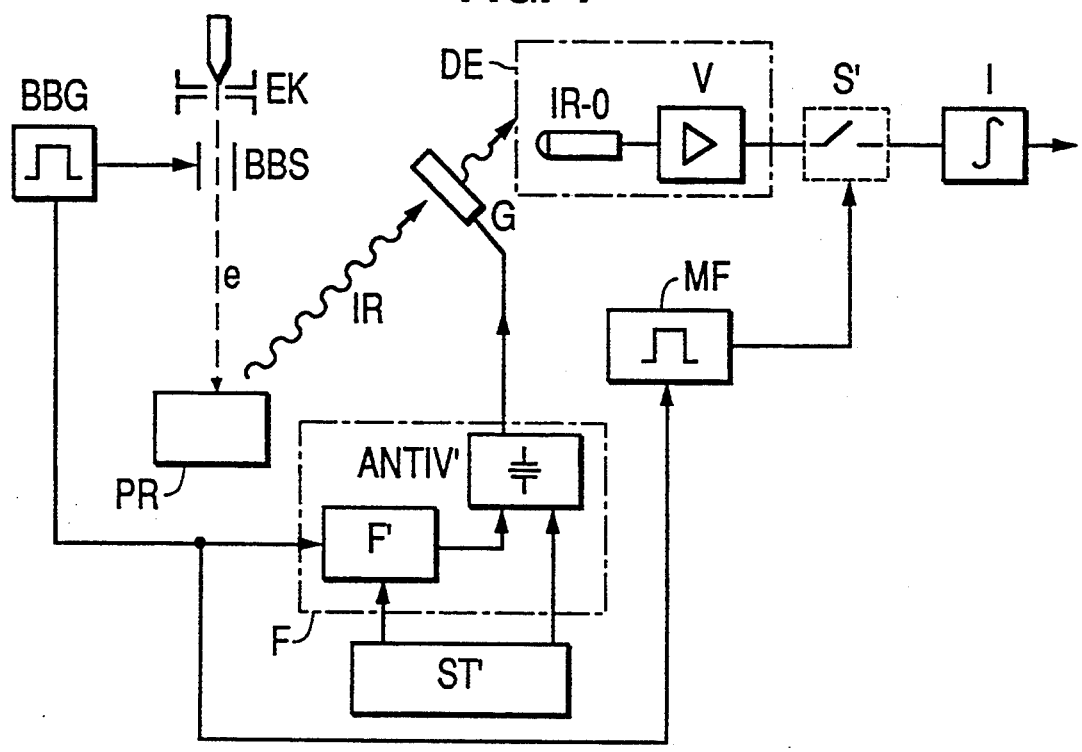
FIGS. 4 and 5 illustrate the use of a basic circuit of this type.

FIG. 4 shows a first application of the basic diagram described in FIG. 3 in the field of infrared measuring techniques or luminescence measuring techniques. The task of the measuring system illustrated there is to measure the temporal course of the infrared light emitted by a process periodically stimulated in a sample PR. The infrared detectors used in FIG. 4 usually have a great amount of self noise for which reason utilization of the process of the invention is particularly useful in this case. The process that causes the emission of the infrared beam may be stimulated in different ways, for example, by applying an electric signal to the sample PR. In the example shown in FIG. 4, short electron impulses are used to stimulate the sample PR. The electron impulses e striking the sample PR cause a secondary infrared radiation IR, which may, for example, be caused by the electron impulses briefly exciting some of the sample atoms. This excited level can only return to the ground level by means of an emission of radiation. An electron gun EK, which continually generates electrons, is used to produce the electron impulses. With the aid of a beam blanking system BBS and a beam blanking generator BBG to control this beam blanking system, short electron impulses are produced from this constant beam of electrons. The secondary infrared beam IR is guided by means of an optical system for guiding and focussing the infrared beam IR, which is not depicted in FIG. 4 for reasons of clarity, by way of an optical gate G to an infrared detector IR-D. A Pockels cell or an acousto-optical modulator may, by way of illustration, be employed as a module for the optical gate. The infrared detector IR-D together with an amplifier V connected behind it forms a detection unit DE behind which an electronic switch S' and an integrator unit I are connected In order to direct the electronic switch S' the latter is connected by way of a monoflop MF to the beam blanking generator BBG. The electronic switch S' passes the measured values detected by the detection unit DE to an integrator I or a circuit for averaging the measured values. The switch S' has the same function as the switch S in the basic diagram of FIG. 3. Since, following the emission of the infrared radiation, a waiting is required for certain relaxation times, long pauses occur between the individual measuring cycles during which the detection unit DE is disconnected from the integrator I by the switch S'. As soon as a new process which causes the emission of infrared radiation is triggered by an electron impulse e, the function generator F' is made to release a sample function $S_i$ by means of a trigger signal from the beam blanking generator BBG. Triggering occurs simultaneously by way of the monoflop MF, thereby closing the switch S' for a measurement. For this purpose, the beam blanking generator BBG is connected by way of a trigger input to the function generator F' and the monoflop MF respectively. The duration of the output impulse from the monoflop MF determines how long the switch S' remains closed. Of course, the reverse is also possible in that the function generator F' can also trigger the beam blanking generator BBG and the monoflop MF instead of the beam blanking generator BBG as described in the first application of FIG. 4. The function generator F' is also connected to a first input of an antivalence gate ANTIV' described in detail once more in FIG. 6. In order to direct function generator F' and also to direct the antivalence gate ANTIV', both are connected by way of respective separate connections to the control ST'.

The multiplication unit M is realized in this illustrated application example by means of the optical gate G; a multiplication by 0 or 1 in this case means an opening or closing of the optical gate. If an acousto-optical modulator is employed, a multiplication other than a binary multiplication can also be achieved. The inverse transformation is performed in an analysis and computer unit not depicted in FIG. 4.

Figure 6:
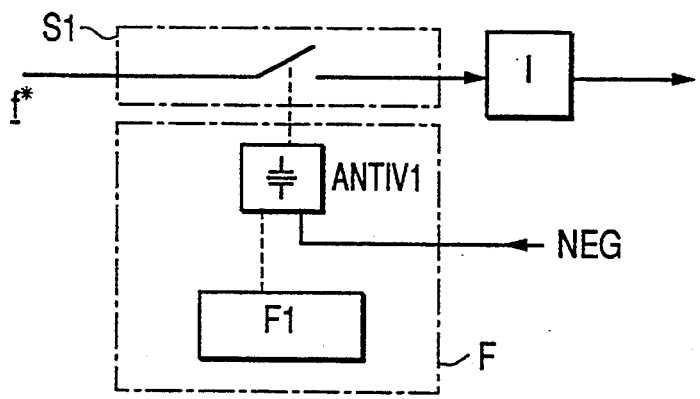
FIGS. 6, 7 and 8 illustrate a realization that is as simple as possible of partial circuits for the process.

As mentioned in detail in FIG. 6, in the case of this realization, compared to measuring processes in which negative values can also be realized for the sampling functions in the multiplications, a doubling of the measuring time must be accepted. Advantage is taken of the fact that the scalar product is bilinear in its form and a sampling function $S_j$ can be divided into a positive and a negative part. In the event that the sampling functions only have values of the same amount having opposite signs, the positive part may be formed by a negation of the negative part and vice versa. This is realized in the circuit by the added antivalence gate ANTIV' which is directly connected with a second input of the control ST'. A logical "1" signal for the negation is always released at the antivalence gate ANTIV' by the control ST' by way of the connection if the negated bit sequence is to be delivered.

The application of the basic diagram of FIG. 3 to the first application of FIG. 4 from the field of infrared measuring techniques or luminescence measuring techniques results in the following realization of the individual components. The multiplication unit M of FIG. 3 is realized by means of an optical gate G in the application example of FIG. 4, whereas switch S' of FIG. 4 fulfills the same function as switch S in the basic diagram of FIG. 3. The function generator F of the basic diagram of FIG. 3, in the first application example of FIG. 4, is formed by two components, a function generator F' and an antivalence gate ANTIV' whereas the control ST' together with the monoflop MF of FIG. 4 reproduce the control ST in the basic diagram of FIG. 3. The integrators I of FIGS. 3 and 4 fulfill the same function, the memory SP connected by integrator I and the analysis calculator unit AE/R of FIG. 3 not being depicted again in the first application example of FIG. 4 for reasons of clarity. The connection line between beam blanking generator BBG and function generator F' and between beam blanking generator BBG and monoflop MF in the first application example of FIG. 4 replace the triggering of control ST by way of the trigger input TR of the basic diagram of FIG. 3.

A second realization of the basic diagram of FIG. 3 in FIG. 5 is taken from the field of laser scanning microscopy (also cf. by way of illustration, F. J. Hanley, M. M. Chi, IEEE/IRPS 1983, p. 122). Also in this case, a double measuring time must be expected compared to measuring processes with negative values for the sampling functions in the multiplications to be carried out.

In this realization example, a current is induced by irradiating an IC circuit IC with a laser source LQ. This current is converted by way of a resistance R which is located in a supply branch in series with a supply voltage source VS for the IC circuit IC, into a proportional voltage value and led to the measuring amplifier V. Behind the measuring amplifier V, an electronic switch S'' is connected which fulfills the same function as the electronic switch S' of FIG. 4 and an integrator I connected behind it. The second application example of FIG. 5 shows that a detector D of the basic diagram of FIG. 3 is not absolutely necessary for this purpose. The integrator I is also not absolutely necessary, for the time constant of the generation and the recombination of the electrons as well as the capacity of the supply voltage are usually so great that the physical mechanism underlying the measuring itself ensures integration. A measuring processing module connected to switch S'' would then just have to perform an averaging over m measurements. The IC circuit itself is connected to a homing unit AE which supplies the required homing signals for the IC circuit. For the intensity modulation of the laser beam, a gate G', for example, a Pockels cell or an acousto-optical modulator, is arranged in the beam path of the laser source LQ-IC circuit. This gate G' is directed by a system consisting of an antivalence gate ANTIV''', a control ST'' and a function generator F'' comparable to the system in FIG. 4. The function generator F'' on the one hand, is connected to the antivalence gate ANTIV''' and, on the other hand, to the electronic switch S''. The mode of operation of the antivalence gate ANTIV''' and the function generator F'' are made more apparent in the following FIG. 6. For the purpose of synchronization between the control ST'' and the IC circuit IC, the control ST'' is connected to the homing unit AE.

When the basic diagram of FIG. 3 is applied to the second application example of FIG. 5, the detector D from FIG. 3 is not required in the second realization example of FIG. 5 because in this case it corresponds to the detection of an electric signal. However, it may be stated that the resistance R and the measuring amplifier V perform detector-like functions in the circuit of FIG. 5 The switch S'', the integrator I'' and the control ST'' of FIG. 5 correspond to the switch S, the integrator I and the control ST respectively of the basic diagram in FIG. 3. The multiplication unit M of the basic diagram in FIG. 3 is realized in the second realization example by means of a physical effect of the charge carrier generation caused by the modulated laser beam. The laser source LQ, the gate G', the antivalence gate ANTIV''' and the function generator F'' may be viewed as parts of the function generator F of the basic diagram of FIG. 3, the output signal of this function generator then being the laser beam modulated in its intensity with the sampling functions $S_j$.

FIG. 6 shows once again a section of the basic diagram of FIG. 3 with a partial realization. In this case, a gate circuit S1 represents the multiplication unit M of FIG. 3, and a function generator F of the basic diagram of FIG. 3 is formed with the aid of a function generator F1 and an antivalence gate ANTIV1 connected behind it. The realization of the function generator F1 with the connected antivalence gate ANTIV1, which may be used in the circuits of FIG. 4 and FIG. 5, is particularly simple. However, double measuring times compared to measuring processes permitting negative values for the sampling functions in the multiplication must be accepted. Advantage is taken of the fact that the scalar product is bilinear in its form and that a sampling function $S_j$ can be divided into a positive part $S_j+$ and a negative part $S_j-$.

$S_j+ = S_j$ at those sites, where $S_j$ is greater than 0  0 otherwise $S_j- = S_j$ at those sites, where $S_j$ is smaller than 0  0 otherwise Thus $S_j = S_j+ -$ and $$f^*\cdot S_j{}^T = f^*\cdot(S_j+ - S_j-)^T = f^*\cdot S_j+ - f^*\cdot S_j- \text{—000 01 06}$$

This is usually true if technically no negative values may be attained (for example, by means of acousto-optical modulators), but nonetheless the sampling functions have negative values. In this case, two measurements must be made with $S_j+$ and with $S_j-$ as the sampling function and subsequently the results must be added or subtracted. This adding or subtracting is performed in a calculator which is not shown and which is connected behind the integrator I. In the event that the sampling functions only have values of the same amount but with opposite signs, $S_j+$ is just the negation of $S_j-$. As a result, in measurement 2, the function generator F only has to supply the negated bit sequence of $S_j+$. This is valid under the condition that $S_j+$ and $S_j-$ are binary sequences.

The multiplication unit only consists of a gate circuit S1 which is controlled by way of an antivalence gate ANTIV1. This antivalence gate is connected with its first input to the function generator F1, the signal for negation NEG being transmitted to its second input. A signal for negation to the antivalence gate ANTIV1 is always emitted when the negated bit sequence of $S_j+$ is to be supplied. The signal for the negation is provided by a control not depicted in FIG. 6. The negated bit sequence may, for course, also be supplied by the function generator F1 itself in that both bit sequences are recorded in shift registers of the function generator F1 and read out alternately. The gate circuit S1 ensures a sampling of the measured values f* and passes them on to the integrator I.

Figure 7:
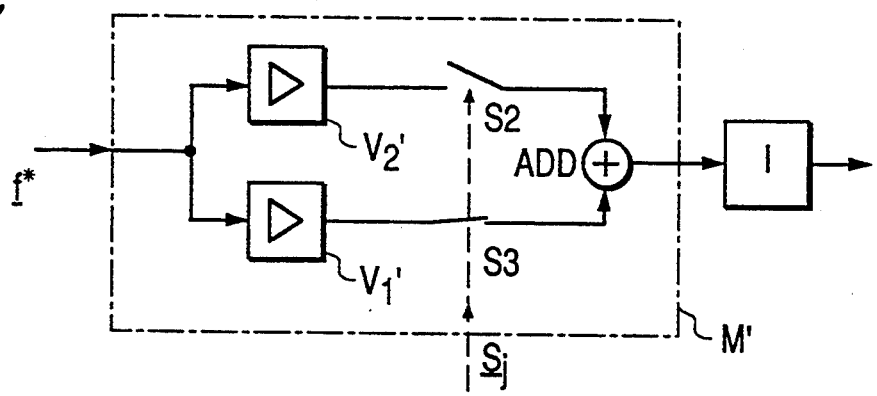

FIG. 7 shows a simple realization of a multiplication unit M' which may be employed in the event that the sampling functions $S_1, S_2, \ldots, S_n$ are only to be the values a and $-a$. In this case, the obtained measured values f* and a sampling function $S_j$ are provided to the multiplication unit M', the multiplication unit M' still being connected to an integrator I already depicted in FIG. 3. The multiplication unit M' contains two amplifier elements $V_1'$, $V_2'$, each having an amplification of a and being connected in parallel. The amplifier element $V_1'$ in this case is set up as the non-inverting amplifier and $V_2'$ as the inverting amplifier. The selected measured signal f* is connected to the respective inputs of amplifier elements $V_1'$, $V_2'$, whereas the outputs of the amplifier elements $V_1'$, $V_2'$ are connected by way of a gate circuit S2, S3 respectively and by way of an addition unit ADD to the integrator I. Both gate circuits S2, S3 are switched alternately in the passage direction depending on the sampling functions $S_j$ given. Switch and amplifier elements may, of course, be exchanged.

Figure 8:
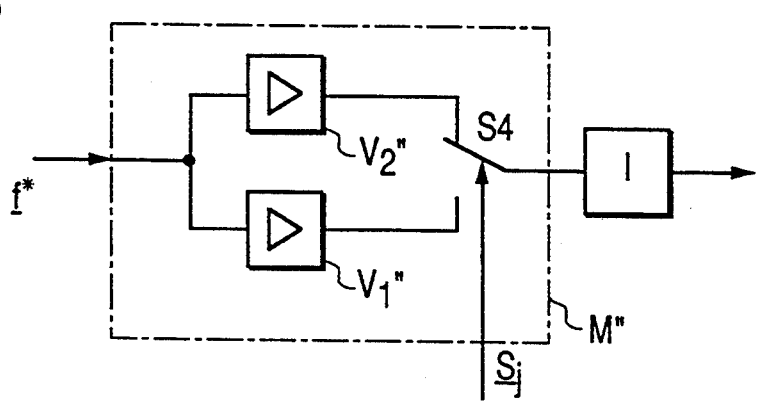

FIG. 8 shows a further realization of a multiplication unit $M''$, set up analogously to the multiplication unit $M'$ in FIG. 7, only that instead of the addition unit ADD and the two gate circuits S2, S3, an alternating gate circuit S4 is built in, connecting alternately an integrator I with the outputs of both amplifier elements $V_1''$, $V_2''$, whereby $V_1''$ is again connected as the not inverting and $V_2''$ as the inverting amplifier. The activation of the alternating gate circuit occurs again depending on the sampling function $S_j$ transmitted.

A generating system which contains at least partially linear dependent vectors many naturally be employed instead of a base composed of linear independent vectors. However, in this case, the performance of the process is reduced.

I claim:

1. A process for measuring the temporal course of a periodic signal, comprising the steps of:
    providing n sampling functions with a maximum of n individual elements each, wherein the sampling functions are not all unit vectors such that not all vectors are $e_i$ with $e_i=(0, \ldots, 1, \ldots 0)$ with $i=1 \ldots n$ and n being an integer;
    sampling, per a given period, the periodic signal at n (n=integer) sampling time points to obtain signal values;
    forming projections of the signal values which correspond to scalar products of the signal values and the sampling functions, whereby the use of sampling functions that are not all unit vectors increases the detected signal energy or signal-to-noise ratio; and
    detecting the projections to provide n measured values.

2. A process according to claim 1, wherein terms of the sampling functions are either −1, 0, or 1.

3. A process according to claim 1, wherein a coordinate transformation is applied to the projections in order to provide a representation of the signal projected with an orthogonal, binary set of sampling functions.

4. A process according to claim 1, wherein the times between the n sampling functions are the same.

5. A process according to claim 1, wherein the n sampling functions form an orthogonal set.

6. A process according to claim 1, wherein the n sampling functions form a set of Rademacher functions.

7. A process according to claim 1, wherein the n sampling functions form a set of Walsh functions.

8. A process according to claim 1, wherein the n sampling functions form a set of transorthogonal functions.

9. A process according to claim 1, wherein the n sampling functions form elements of a Hadamard matrix.

10. A process according to claim 1, wherein the absolute value of the terms of the sampling functions equal either zero or a predetermined constant and wherein some terms have a negative value and some terms have a positive value.

11. A process according to the claim 1, wherein each individual n sampling points is sampled up to m times (m=integer) and an averaging is performed in order to provide n estimated values for the n signal values.

12. A process according to claim 11, wherein the averaging procedure occurs for each individual signal value following multiple sampling of the entire periodic signal.

13. A process according to claim 11, wherein the averaging procedure is performed directly for each individual signal value by m-times sampling of the respective signal value.

14. A process according to claim 11, wherein the step of selecting the generating system occurs in such a manner that an optimality criterion is fulfilled which requires that an average square deviating of the estimated values from the periodic signal is kept as small as possible.

15. A system for measuring the temporal course of a periodic signal comprising:
    a multiplication unit that increases the average detected signal energy or the signal-to-noise ratio, the multiplication unit having an output and a plurality of inputs, with one input connected to the periodic signal;
    a function generator which supplies sampling functions which are not all unit vectors, the function generator having an output connected to another of said inputs of the multiplication unit;
    a memory unit coupled to the output of the multiplication unit;
    a memory output and calculator unit connected to the memory unit; and
    a control unit coupled to the function generator, the memory unit and the memory output and calculator unit, and controlling the function generator, the memory unit and the memory output and calculator unit.

16. A system according to claim 15, wherein between the multiplication unit and the memory is connected a detector having an electronic switch connected behind it and a means for averaging, the means for averaging and the electronic switch being connected to and controlled by the control.

17. A system according to claim 15, wherein the function generator contains a ring shift register containing at least one sampling function, which is released serially.

18. A system according to claim 15, wherein the function generator contains a digit generator for producing a binary digit sequence.

19. A system according to claim 15, wherein the function generator contains an anti-valence gate, the sampling functions are sampled at an output of the anti-valence gate, which at the same time represents the output of the function generator, and a signal for negation is switched to an input of the anti-valence gate.

20. A system according to claim 15, wherein the multiplication unit contains in a first and second realization at an input side, two parallelly switched amplifier elements to inputs of which the measured values are transmitted and outputs of which can be connected selectively to the integrator via a first gate circuit directed by the sampling functions.

21. A system according to claim 20, wherein the two parallelly switched amplifier elements have the same amplification, whereby a first amplifier element is connected as a non-inverting amplifier and a second amplifier element as inverting amplifier.

22. A system according to claim 15, wherein the multiplication unit is a gate circuit.

23. A system according to claim 22, wherein the multiplication unit is an optical gate.

24. A system according to claim 23, wherein the optical gate includes a Pockels cell.

25. A system according to claim 23, wherein the optical gate includes an acousto-optical modulator.

26. A process for measuring the temporal course of a periodic signal, comprising the steps of:

providing n sampling functions with a maximum of n individual elements each, wherein the sum of the magnitude of the elements of the sampling functions is greater than n;

sampling, per a given period, a maximum of an signal values of the periodic signal at n (n=integer) sampling time points;

forming projections of the signal values corresponding to scalar products of the signal values and the sampling functions to thereby increase energy of the signal prior to detection; and detecting the signal with increased energy to provide n measured values.

27. A system for measuring the temporal course of a periodic signal comprising:

a multiplication unit that increases energy of the signal prior to detection of the signal;

a function generator which supplies sampling functions wherein the sum of the magnitude of the elements of the sampling functions is greater than the number of samples;

a control;

a memory having a memory output and calculator unit;

wherein an output of the function generator and the signal to be measured are connected each to an input of the multiplication unit;

wherein an output of the multiplication unit is connected to the memory, whereby the memory is connected to the memory output and calculator unit; and wherein the function generator, the memory and the memory output and calculator unit are connected to the control and are directed by the control.

* * * * *